United States Patent
Bilbao De Mendizabal et al.

(10) Patent No.: US 11,085,976 B2
(45) Date of Patent: Aug. 10, 2021

(54) REDUNDANT SENSOR FAULT DETECTION

(71) Applicant: Melexis Technologies SA, Bevaix (CH)

(72) Inventors: Javier Bilbao De Mendizabal, Zurich (CH); Mathieu Poezart, Saint-Aubin-Sauges (CH)

(73) Assignee: MELEXIS TECHNOLOGIES SA, Bevaix (CH)

( * ) Notice: Subject to any disclaimer, the term of this patent is extended or adjusted under 35 U.S.C. 154(b) by 92 days.

(21) Appl. No.: 16/150,653

(22) Filed: Oct. 3, 2018

(65) Prior Publication Data

US 2019/0107586 A1   Apr. 11, 2019

(30) Foreign Application Priority Data

Oct. 10, 2017   (EP) .................... 17195636

(51) Int. Cl.
  *G01R 33/00*   (2006.01)
  *G01R 31/3187*   (2006.01)
  (Continued)

(52) U.S. Cl.
  CPC ....... *G01R 33/072* (2013.01); *G01D 5/24461* (2013.01); *G01D 5/24466* (2013.01);
  (Continued)

(58) Field of Classification Search
  CPC ...... G01R 33/072; G01R 33/07; G01R 33/09; G01R 33/0082; G01R 33/0029;
  (Continued)

(56) References Cited

U.S. PATENT DOCUMENTS 5,491,631 A   2/1996   Shirane et al.
7,664,619 B2   2/2010   Kameya et al.
(Continued)

FOREIGN PATENT DOCUMENTS

CN   101013152 A   8/2007
CN   203178236 U   9/2013
(Continued)

OTHER PUBLICATIONS

JP2010190872 English translation (Year: 2010).*
(Continued)

*Primary Examiner* — Tung X Nguyen
*Assistant Examiner* — Feba Pothen
(74) *Attorney, Agent, or Firm* — Workman Nydegger

(57) ABSTRACT

A field-sensor device comprises first and second field sensors disposed in corresponding different first and second orientations, each responsive to an external field to produce corresponding first and second sensor signals. One of or both the first and second sensor signals are converted to equivalent comparable sensor signals in a common orientation and compared to determine a faulty field sensor. If a faulty field sensor is determined, a faulty sensor signal is produced or, if a faulty sensor is not determined, an output sensor signal responsive to the first, second or comparable sensor signals is produced. Evaluation of the direction of differences between the comparable sensor signals can determine which of the first and second field sensors is faulty.

15 Claims, 5 Drawing Sheets

(51) Int. Cl.
  *G01R 33/07* (2006.01)
  *G01D 5/244* (2006.01)
  *G01R 35/00* (2006.01)
  *G01R 33/09* (2006.01)
  *H01L 43/06* (2006.01)

(52) U.S. Cl.
  CPC ..... *G01R 33/0029* (2013.01); *G01R 33/0035* (2013.01); *G01R 33/0082* (2013.01); *G01R 33/07* (2013.01); *G01R 33/09* (2013.01); *G01R 35/00* (2013.01); *G01R 31/3187* (2013.01); *H01L 43/065* (2013.01)

(58) Field of Classification Search
  CPC .......................... G01R 35/00; G01R 33/0035; G01R 31/3187; G01D 5/24466; G01D 5/24461; G01D 18/00; H01L 43/065
  See application file for complete search history.

(56) References Cited

U.S. PATENT DOCUMENTS

| | | |
|---|---|---|
| 8,749,005 B1 | 6/2014 | Foletto et al. |
| 9,291,666 B2 | 3/2016 | Ueno et al. |
| 9,523,589 B2 | 12/2016 | Nakamura et al. |
| 9,581,426 B2 | 2/2017 | Okamoto et al. |
| 9,581,633 B2 | 2/2017 | Muto |
| 9,581,657 B2 | 2/2017 | Rasbornig et al. |
| 9,599,502 B2 | 3/2017 | Tao et al. |
| 9,638,765 B2 | 5/2017 | Kern et al. |
| 2013/0335069 A1 | 12/2013 | Vig et al. |
| 2014/0159756 A1 | 6/2014 | Ueno et al. |
| 2014/0172337 A1 | 6/2014 | Kern et al. |
| 2014/0225596 A1* | 8/2014 | Nakamura ............. G01R 33/07 324/207.2 |
| 2015/0015270 A1 | 1/2015 | Muto |
| 2015/0022191 A1* | 1/2015 | Ausserlechner ....... G01R 33/02 324/207.21 |
| 2015/0185279 A1 | 7/2015 | Milano et al. |
| 2015/0346290 A1* | 12/2015 | Holm ................. G01R 33/0023 324/202 |
| 2016/0011279 A1 | 1/2016 | Rasbornig et al. |
| 2016/0025548 A1 | 1/2016 | Tao et al. |
| 2016/0252599 A1 | 9/2016 | Motz et al. |
| 2016/0299200 A1 | 10/2016 | Taylor et al. |
| 2018/0136999 A1* | 5/2018 | Fernandez ......... G01R 33/0029 |
| 2019/0310113 A1* | 10/2019 | Riedmueller .......... G01D 5/145 |

FOREIGN PATENT DOCUMENTS

| | | |
|---|---|---|
| CN | 103424651 A | 12/2013 |
| CN | 103703382 A | 4/2014 |
| CN | 103869266 A | 6/2014 |
| CN | 104048692 A | 9/2014 |
| CN | 104136899 A | 11/2014 |
| CN | 104142120 A | 11/2014 |
| CN | 105259519 A | 1/2016 |
| CN | 205038526 U | 2/2016 |
| DE | 102014103556 A1 | 9/2014 |
| JP | 2010190872 * | 9/2010 |
| KR | 101464501 B1 | 12/2014 |
| WO | 2015038564 A1 | 3/2015 |

OTHER PUBLICATIONS

European Search Report from EP Application No. EP 17195636, dated Jul. 16, 2018.

Office Action from corresponding Chinese Application No. 201811173442.0, dated Oct. 8, 2019.

* cited by examiner

REDUNDANT SENSOR FAULT DETECTION

FIELD OF THE INVENTION

The present invention is generally related to field sensor fault detection structures, circuits and methods.

BACKGROUND OF THE INVENTION

Sensors are widely used in electronic devices to measure attributes of the environment and report a measured sensor value. In particular, magnetic sensors are used to measure magnetic fields, for example in transportation systems such as automobiles. Magnetic sensors can incorporate Hall-effect sensors that generate an output voltage proportional to an applied magnetic field or magneto-resistive materials whose electrical resistance changes in response to an external magnetic field. In many applications, it is desirable that sensors are small and are integrated with electronic processing circuitry so as to reduce the overall sensor size and provide improved measurements and integration into external electronic systems. For example, US2016/299200 describes a Hall-effect magnetic sensor for measuring magnetic fields incorporating an integrated circuit formed in a semiconductor material on a substrate, together with insulation and adhesive layers.

Measurements from sensors can drift over time, providing varying measurements even when exposed to the same field. For example, field measurements can be offset from a desired nominal value, the sensitivity can vary so that measurements are a multiple (either greater or less than one) of the desired value, or both. Such variation can be the result of changes in environmental conditions, for example temperature or humidity or operational factors, such as vibration or aging. Moreover, devices can fail over time for similar reasons. Furthermore, the materials from which sensors are made can have defects that affect the accuracy, offset bias or symmetry of the sensor's response.

It is important, therefore, to include diagnostic capabilities to detect faults or failures in complex, safety-critical systems, such as automotive systems, so that repairs can be performed or replacements can be provided for any faulty or failed sensor devices. For example, WO2015/038564 describes a method for verifying measurements from a magnetic Hall-effect sensor in a Hall-effect sensor system. In this approach, the Hall-effect sensor is excited with an excitation current having a first value. A first measurement corresponding to a voltage output of the Hall-effect sensor when the Hall-effect sensor is excited with the excitation current having the first value is obtained. Additionally, the Hall-effect sensor is excited with the excitation current having a second value, the second value being different from the first value. A second measurement corresponding to a voltage output of the Hall-effect sensor when the Hall-effect sensor is excited with the excitation current having the second value is obtained. Operation of the Hall-effect sensor is then verified based at least on the first measurement and the second measurement.

Another approach to managing diagnostics in a magnetic field sensor is described in US2016/252599 A1. This design uses switches associated with a magnetic field sensor that provide error information. In particular, a device is provided that includes a magnetic field sensor, a plurality of switches associated with the magnetic field sensor and a control circuit configured to control the plurality of switches and to provide at least one signal indicative of a fault based on operation of the switches.

U.S. Pat. No. 9,523,589 describes a rotation angle measurement apparatus having four Hall element pairs for detecting magnetic field components in four different directions and used to calculate the position of a rotating magnet. The angles of the detected field components are compared to determine faults. In this design the amplitude calculation unit calculates a first amplitude value M representing the magnetic field strength from the rotating magnet based upon the strengths of the output signals from the first Hall element pair and the second Hall element pair, and calculates a second amplitude value Mc representing the magnetic field strength from the rotating magnet based upon the strengths of the output signals from the third Hall element pair and the fourth Hall element pair. Thus, the amplitude calculation unit calculates plural pieces of the amplitude information based upon the output signals from the plural pairs of Hall elements (i.e., magnetic sensors); the output signals correspond to the plural pieces of rotation angle information and the fault is determined by a comparison of the plural pieces of rotation angle information and, in some versions with the strength of the rotating element field.

U.S. Pat. No. 8,749,005 describes a magnetic field sensor with a plurality of polygonally arranged vertical hall elements. U.S. Pat. No. 9,581,426 discloses a magnetic field measuring device having four magneto-electric transducers on a magneto-sensing surface. U.S. Pat. No. 7,664,619 describes a fault detection unit for a rotation angle detecting device by comparing the measured values to normal ranges and otherwise determines faults.

Since field sensors are subject to operating or structural faults or defects in the sensor materials or devices that lead to incorrect field measurements, there is a need for circuits and methods in sensor devices and systems that operate and test the sensor devices and systems to detect or correct faults in the sensor under critical operating conditions.

SUMMARY OF THE INVENTION

It is an object of embodiments of the present invention to provide for a field-sensor device capable of detecting errors in a sensor.

The above objective is accomplished by the solution according to the present invention.

Embodiments of the present invention provide a field-sensor device comprising a first field sensor disposed in a first orientation, the first field sensor responsive to an external field to produce a first sensor signal, a second field sensor disposed in a second orientation different from the first orientation, the second field sensor responsive to the external field to produce a second sensor signal, and a controller having a control circuit that controls the first and second field sensors to produce corresponding first and second sensor signals, receives the first and second sensor signals, converts the first or second sensor signal, or both, to equivalent comparable sensor signals in a common orientation, compares the comparable sensor signals to determine a faulty field sensor, if any, and, if a faulty field sensor is determined, optionally provides a faulty sensor signal and determines which of the first and second field sensors is faulty or, if a faulty sensor is not determined, provides an output sensor signal responsive to the first, second or comparable sensor signals.

According to embodiments of the present invention, a field is an environmental attribute or characteristic that has a magnitude and a direction, for example a vector field. In various embodiments, the field can be a magnetic field, a pressure field, an electric field or a gravitational field and the field sensor can be a magnetic field sensor, a pressure field sensor, an electric field sensor or a gravitational field sensor.

In some embodiments of the present invention, the first orientation differs from the second orientation in two orthogonal dimensions. In other embodiments of the present invention, the first orientation differs from the second orientation in three orthogonal dimensions. The first and second orientations can be corresponding first and second coordinate systems, directions or dimensions. An orientation of a sensor is determined by the axes of measurement provided by the sensor. If a first sensor has a measurement axis that is not co-linear with the measurement axis of a second sensor, the first and second sensors have different orientations in at least the dimension defined by the measurement axis.

In some configurations the control circuit includes a storage circuit for storing any one or more of the first sensor signal, the second sensor signal, and any comparable sensor signal. In some configurations, the control circuit includes a conversion circuit (e.g., a computer with a stored software program) for converting either or both of the first sensor signal and the second sensor signal to a different orientation or coordinate system. In some configurations the control circuit includes a comparison circuit for comparing any one or more of the first sensor signal, the second sensor signal and any comparable sensor signal.

In some embodiments the first or second field sensor is an angular field sensor that comprises one or more sensor elements, pairs of sensor elements or is a bridge sensor having multiple sensor elements that can measure the angle of a field vector with respect to a coordinate system. Each sensor element or pair of sensor elements can measure a field vector in a particular direction and the sensor elements or pairs of sensor elements in a common angular field sensor can be arranged orthogonally to measure the field in different directions, thus providing an angular measurement with respect to the coordinate system. For example, a first angular field sensor can measure a field having a direction and magnitude and provide an angular sensor measurement having two components, for example Bx, By according to a first coordinate system. A second angular field sensor can measure the same field and provide an angular sensor measurement having two components, for example Bx', By' according to a second coordinate system different from the first coordinate system. The two measurements, taken in different coordinate systems, can be compared by converting them to a common, comparable coordinate system, for example by converting the Bx' and By' measurements to the first coordinate system, by converting the Bx and By measurements to the second coordinate system, or by converting both the Bx and By measurements and the Bx' and By' measurements to a third, common coordinate system.

In some configurations the first and second field sensors are disposed on a device substrate comprising a substrate material and the first or second field sensors comprise one or more sensor materials at least partially different from the substrate material. The substrate material can be a semiconductor and the control circuit can be at least partially formed in or on the semiconductor substrate. The control circuit can comprise a control-circuit material that is at least partially different from the substrate material and the control circuit can be disposed on the substrate.

A method of diagnosing a field-sensor device according to an embodiment of the present invention comprises providing a field-sensor device, providing electrical power to the field-sensor device, using the control circuit to control the first and second field sensors to produce respective first and second sensor signals, using the control circuit to receive the first and second sensor signals, using the control circuit to convert the first or second sensor signal, or both, to equivalent comparable sensor signals in a common orientation, and using the control circuit to compare the comparable sensor signals and determine if the first or second field sensor is faulty, and if a faulty field sensor is determined, using the control circuit to provide a faulty sensor signal responsive to the comparable sensor signals and, optionally, to determine which of the first and second field sensors is faulty, or if a faulty field sensor is not determined, using the control circuit to provide an output sensor signal responsive to the first, second, or comparable sensor signals. If the second field sensor is faulty, an output sensor signal that is the first sensor signal or is derived from the first sensor signal can be provided. If the first field sensor is faulty, an output sensor signal that is the second sensor signal or is derived from the second sensor signal can be provided. Thus, field-sensor devices of the present invention can continue to operate even when one of the field sensors has failed by identifying the failed field sensor and using sensor signals from a remaining other field sensor.

In some embodiments the first sensor or the second sensor comprises two or more sensor elements and if one of the first or second sensors is faulty, which of the two or more sensor elements is faulty is determined by comparing and categorizing the different measurements of the first and second sensors, where the first sensor measures the field in x and y dimensions and the second sensor measure the field in x' and y' dimensions different from the x, y dimensions. If the measurements are converted to the first coordinate system and the difference is in the x direction then the x-sensor element of the first sensor is faulty. If the difference is in the y direction then the y-sensor element of the first sensor is faulty. If the difference is in the x' direction then the x'-sensor element of the second sensor is faulty. If the difference is in the y' direction then the y'-sensor element of the second sensor is faulty. A difference can be determined when it exceeds a pre-determined magnitude threshold, tolerance or margin so that small differences, for example due to manufacturing variability, are not necessary considered to be faults.

In some embodiments the steps are repeated at a first time and the first, second or any comparable sensor signals are stored. The steps are repeated at a second time different from the first time, and any one or more of the stored signals and any one of the first, second or comparable sensor signals of the second time are compared, processed or combined. In other embodiments the comparable sensor signals or signals derived from the first and second sensor signals are combined to provide the output sensor signal. In various embodiments of the present invention, the sensor is a magnetic Hall-effect sensor or a magneto-resistive sensor. The sensor can be a bridge sensor, can incorporate a plurality of sensor elements or can incorporate one or more pairs of sensor elements. Pairs of sensor elements can be oriented in different directions or dimensions within a field sensor.

Embodiments of the present invention provide sensor devices having improved diagnostic capability using smaller and less expensive circuits and can compensate or detect faults or fine defects in the sensor or sensor material. Faults can include, but are not limited to, disconnection, high-resistance connections, short circuits or material faults. The detection can occur at the same time that the sensor circuit is operating.

For purposes of summarizing the invention and the advantages achieved over the prior art, certain objects and advantages of the invention have been described herein above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

The above and other aspects of the invention will be apparent from and elucidated with reference to the embodiment(s) described hereinafter.

BRIEF DESCRIPTION OF THE DRAWINGS

The foregoing and other objects, aspects, features, and advantages of the present disclosure will become more apparent and better understood by referring to the following description taken in conjunction with the accompanying drawings.

DETAILED DESCRIPTION OF ILLUSTRATIVE EMBODIMENTS

Figure 1:
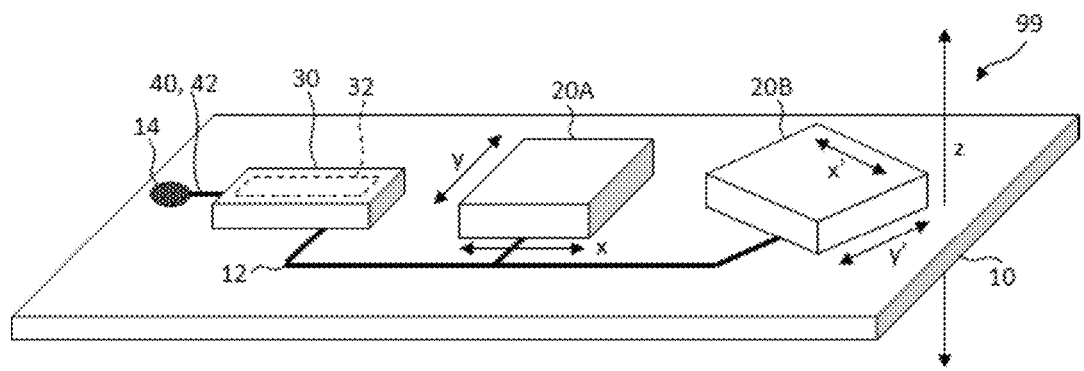
FIG. 1 is a perspective of illustrative embodiments of the present invention.

The present invention will be described with respect to particular embodiments and with reference to certain drawings but the invention is not limited thereto but only by the claims. The features and advantages of the present disclosure will become more apparent from the detailed description set forth below when taken in conjunction with the drawings, in which like reference characters identify corresponding elements throughout. In the drawings, like reference numbers generally indicate identical, functionally similar, and/or structurally similar elements. The figures are not drawn to scale since the variation in size of various elements in the Figures is too great to permit depiction to scale.

Furthermore, the terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

It should be noted that the use of particular terminology when describing certain features or aspects of the invention should not be taken to imply that the terminology is being re-defined herein to be restricted to include any specific characteristics of the features or aspects of the invention with which that terminology is associated.

In the description provided herein, numerous specific details are set forth. However, it is understood that embodiments of the invention may be practiced without these specific details. In other instances, well-known methods, structures and techniques have not been shown in detail in order not to obscure an understanding of this description.

Embodiments of the present invention provide sensor devices having improved diagnostic capability using smaller and less expensive circuits and can compensate for, detect or diagnose faults or fine defects in the sensor material or damage to the sensor while the sensor device is operating. Such defects can be inherent in the material used to make the sensor or can be formed over time, as a result of use or in response to mechanical or other environmental stresses on the sensor. In various embodiments of the present invention sensors can detect fields having vectors comprising a direction and magnitude, for example magnetic fields, electrical fields, pressure fields or gravitational fields.

Figure 2:
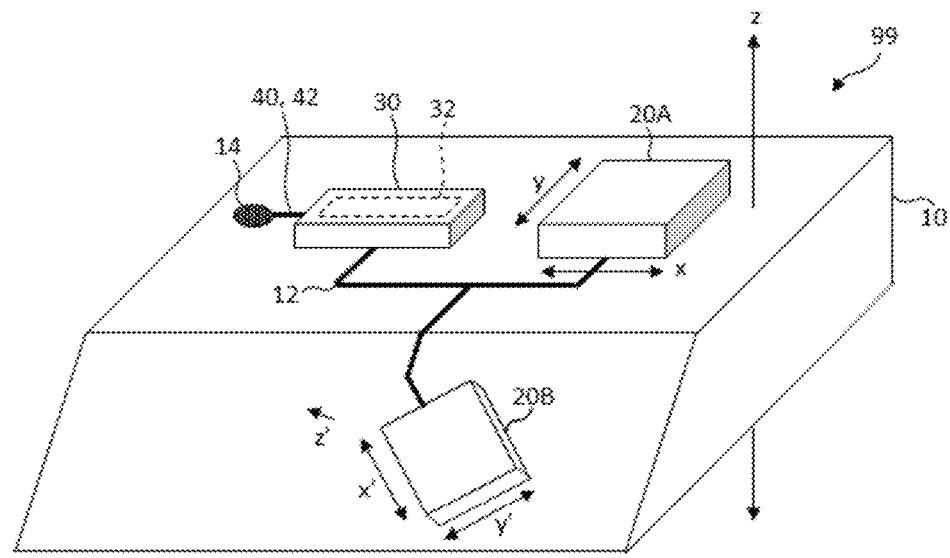
FIG. 2 is a perspective of other illustrative embodiments of the present invention.

Referring to FIGS. 1 and 2, in embodiments of the present invention a field-sensor device 99 comprises a first field sensor 20A disposed in a first orientation responsive to an external field to produce a first sensor signal and a second field sensor 20B disposed in a second orientation different from the first orientation responsive to the external field to produce a second sensor signal. The first and second field sensors 20A, 20B are referred to collectively as field sensors 20. A controller 30 comprises a control circuit 32 that controls the first and second field sensors 20A, 20B to produce corresponding first and second sensor signals, receives the first and second sensor signals, converts the first or second sensor signal, or both, to equivalent comparable sensor signals in a common orientation or coordinate system, compares the comparable sensor signals to determine if the first or second field sensor 20A, 20B is faulty and, if a faulty field sensor 20 is determined, provides a faulty sensor signal 42 and optionally determines which of the first and second field sensors 20A, 20B is faulty. If a faulty field sensor 20 is not determined, the controller 30 provides an output sensor signal 40 responsive to the first, second or comparable sensor signals indicating attributes of the sensed field. In various embodiments the field is a magnetic field, an electrical field, a pressure field or a gravitational field and the sensors 20 are magnetic field sensors, electrical field sensors, pressure field sensors or gravitational field sensors. The first and second orientations can also be described as corresponding first and second coordinate systems, directions or dimensions, for example each having x, y or z orthogonal dimensions. In other embodiments of the present invention, more than two or more than three field sensors 20 comprise the field-sensor device 99.

Conventionally, comparisons between the measurements of a common field by multiple sensors can indicate a fault in one of the sensors when the measurements differ. However, according to embodiments of the present invention the first and second field sensors 20 have different orientations so that at least some of their measurement axes are not co-linear and the field sensors 20 therefore provide redundant field measurements in different coordinate systems. Thus, a comparison of the redundant field measurements in a common coordinate system can not only indicate errors or faults in the first or second field sensors 20, but indicate which field sensor 20 is at fault, providing an additional test and check of the field sensors 20. Furthermore, by identifying the failed field sensor 20, the field-sensor device 99 can continue to operate by using the sensed signals from other field sensors 20, in contrast to sensor systems that can detect a failure, but cannot continue to operate because the failure cannot be identified or associated with a specific field sensor. In further embodiments comprising more than two field sensors 20, more than two sensor signals can be converted to a common orientation and more than two comparable signals can be compared to determine faulty field sensors 20.

The first field sensor 20A, the second field sensor 20B and the controller 30 can be disposed on a device substrate 10 and electrically connected with electrical conductors, such as wires 12, and can include single wires 12 or buses comprising multiple wires 12 that can communicate power, ground and control signals to or from the field-sensor device 99, the controller 30, the first field sensor 20A or the second field sensor 20B. The field sensors 20 can be Hall-effect field sensors or magneto-resistive sensors and can comprise a compound semiconductor material. Alternatively, the field sensors 20 are electric field sensors, pressure field sensors or gravitational field sensors and can, for example, incorporate micro-electro-mechanical systems (MEMS) devices.

The first and second field sensors 20A, 20B can be disposed in a common plane or on a common surface, as shown in FIG. 1 and, if the first field sensor 20A is rotated with respect to the second field sensor 20B, the first field sensor 20A differs in two orientations (two dimensions or two directions, x, y) from the second field sensor 20B (x', y'), defining different coordinate systems for the first and second field sensors 20. Only the vertical z dimension has the same direction. As shown in FIG. 2, the second field sensor 20B is disposed on a surface that is at an incline of approximately 45 degrees with respect to the surface on which the first field sensor 20A is disposed and is rotated 45 degrees with respect to the first field sensor 20A. Thus, as shown in FIG. 2, the first field sensor 20A is also rotated in the z dimension from the second field sensor 20B so that the first field sensor 20A differs in three orientations (three dimensions or directions, x, y, z) from the second field sensor 20B (x', y', z').

The controller 30 can be a discrete or integrated circuit or include both discrete and integrated components, and the control circuit 32 can be an analog, digital or mixed-signal circuit. The wires 12 can be any patterned electrical conductor, for example a metal, metal alloy, a conductive metal oxide, or a conductive polymer. The device substrate 10 can be any substrate having one or more surfaces on which the first and second field sensors 20A, 20B can be disposed and electrically connected. The controller 30 can also be, but is not necessarily, disposed on a surface of the substrate 10.

The field-sensor device 99 can be electrically connected to an external system through electrical contact pads 14 formed on the device substrate 10 that are electrically connected through wires 12 to the controller 30. Although FIGS. 1 and 2 illustrate the controller 30 as disposed on the device substrate 10, in other embodiments of the present invention, the controller 30 is provided on a substrate or structure (e.g., a printed circuit board) separate from the device substrate 10. Similarly, the first and second field sensors 20A, 20B can be disposed on different substrates, surfaces or devices.

Figure 3:
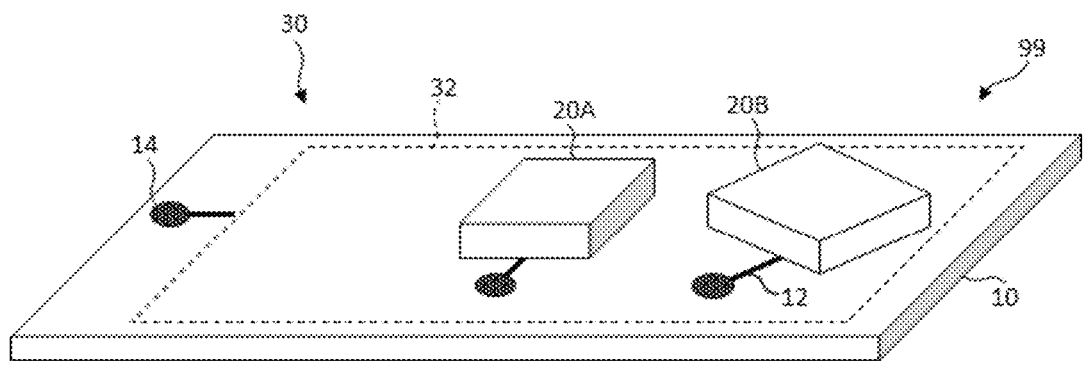
FIG. 3 is a perspective of another illustrative embodiment of the present invention.

Referring to FIG. 3, in some embodiments the device substrate 10 is or comprises a semiconductor substrate comprising at least a portion of the controller 30 and the control circuit 32 is formed in or on the semiconductor substrate. In another embodiment and as shown in FIGS. 1 and 2, the controller 30 is an integrated circuit disposed on the device substrate 10 and the device substrate 10 is a dielectric or has a dielectric layer or surface. Thus, the device substrate 10 can comprise a substrate material that is at least partially different from a material of the first and second field sensors 20A, 20B and is at least partially different from a material of the control circuit 32. In some embodiments the first and second field sensors 20A, 20B comprise compound semiconductors, the controller 30 comprises a silicon semiconductor and the substrate material comprises a dielectric (FIGS. 1 and 2). In another embodiment the first and second field sensors 20A, 20B comprise compound semiconductors and the device substrate 10 material comprises a silicon semiconductor and the control circuit 32 is formed in or as part of the silicon semiconductor (FIG. 3).

Figure 4:
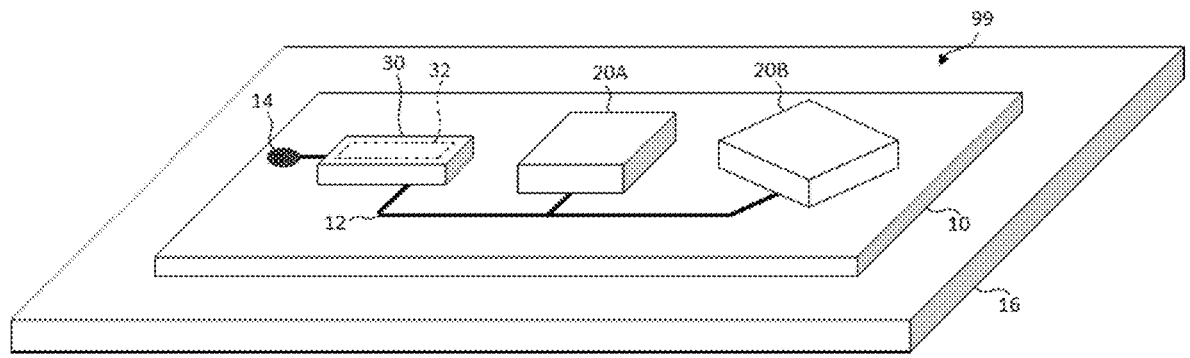
FIG. 4 is a perspective of alternative illustrative embodiments of the present invention.

Referring to FIG. 4, the device substrate 10 can be mounted on a system substrate 16, for example a system substrate 16 of another device or system. Any one of the device substrate 10, the controller 30, the first field sensor 20A or the second field sensor 20B can be a micro-transfer printed component and comprise a fractured, broken or separated tether. The controller 30, the first field sensor 20A, or the second field sensor 20B can be integrated circuits or bare die and can be micro-transfer printed onto the device substrate 10 and the device substrate 10 can be micro-transfer printed onto the system substrate 16.

In embodiments of the present invention the first orientation differs from the second orientation in one dimension, in two dimensions as shown in FIG. 1, or in three dimensions as shown in FIG. 2. In some embodiments the dimensions in each orientation are orthogonal, in other embodiments the dimensions are not orthogonal. For example, FIG. 5A illustrates three orthogonal dimensions (x, y, z) in one orientation or coordinate system, FIG. 5B illustrates three orthogonal dimensions (x', y', z) in another orientation or coordinate system in which the x' and y' dimensions are rotated by 45 degrees with respect to the orientation of FIG. 5A but the z dimension has the same orientation so that the orientation of FIG. 5B differs from the orientation of FIG. 5A in two dimensions.

Figure 5A:
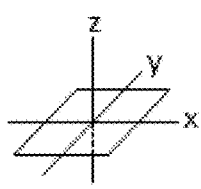
FIG. 5A illustrates a first coordinate system according to embodiments of the present invention.
Figure 5B:
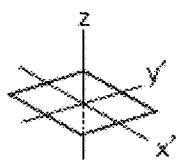
FIG. 5B illustrates a second coordinate system according to embodiments of the present invention.
Figure 5C:
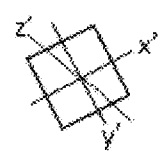
FIG. 5C illustrates a third coordinate system according to embodiments of the present invention.

FIG. 5C illustrates three orthogonal dimensions (x', y', z') in yet another orientation or coordinate system in which the x, y, and z dimensions are all rotated by 45 degrees with respect to FIG. 5A so that the orientation of FIG. 5C differs from the orientation of FIG. 5A in three dimensions. The first and second field sensors 20A, 20B illustrated in FIG. 1 have different first and second orientations corresponding to the different orientations of FIGS. 5A and 5B. The first and second field sensors 20A, 20B illustrated in FIG. 2 have different first and second orientations corresponding to the different orientations of FIGS. 5A and 5C.

Figure 6:
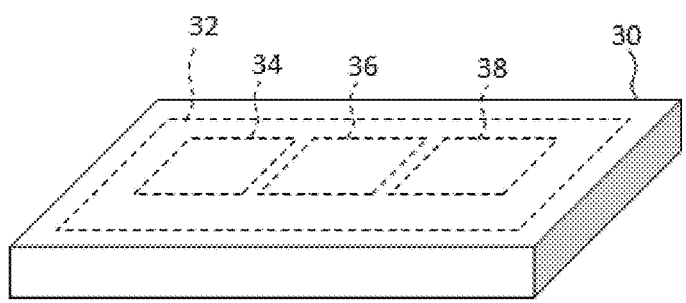
FIG. 6 is a perspective illustration of a controller according to illustrative embodiments of the present invention.

Referring to FIG. 6, the control circuit 32 includes a storage circuit 34 for storing any one or more of the first sensor signal, the second sensor signal and any converted or comparable sensor signal, a conversion circuit 36 for converting the first or second sensor signals to comparable sensor signals and a comparison circuit 38 for comparing any one or more of the first sensor signal, the second sensor signal and any comparable sensor signals or predetermined tolerance, margins or threshold values. The circuits can be, for example, silicon circuits, either analog circuits or digital circuits, for example CMOS circuits.

Figure 7:
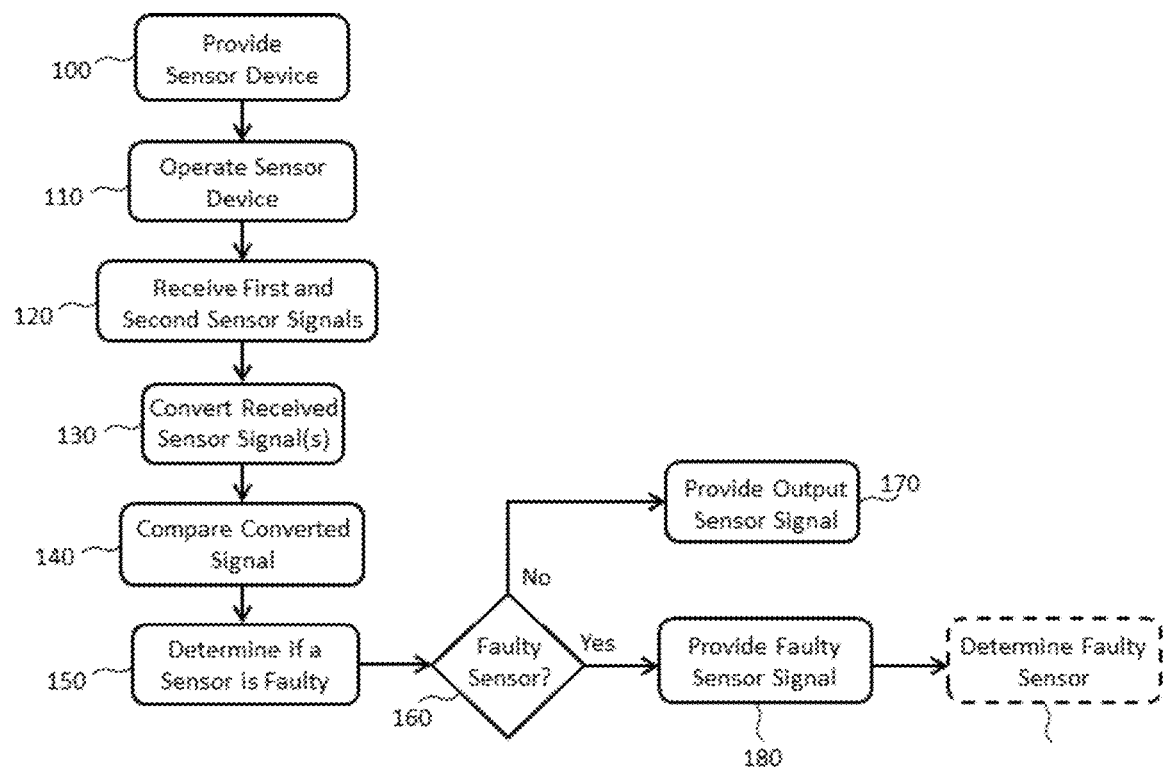
FIG. 7 is a flow chart of a method according to illustrative embodiments of the present invention

Referring to FIG. 7, according to embodiments of the present invention a field-sensor diagnostic method comprises providing a field-sensor device 99 in step 100 and providing power to the field-sensor device 99 to operate the field-sensor device 99 in step 110. In step 120 the control circuit 32 is used to control the first and second field sensors 20A, 20B to produce first and second sensor signals and receives the respective first and second sensor signals. In step 130 the control circuit 32 is used to convert the received first or second sensor signal, or both, to equivalent comparable sensor signals in a common orientation or coordinate system and compares them in step 140. The control circuit 32 then determines in step 150 if either the first field sensor 20A or the second field sensor 20B is faulty. If a field sensor 20 is faulty (tested in step 160), the control circuit 32 is used to provide a faulty sensor signal 42 responsive to the comparable sensor signals (step 180) and, optionally, to determine which of the first and second field sensors 20A, 20B is faulty (step 190). If a field sensor 20 is not faulty (tested in step 160), the control circuit 32 is used to provide an output sensor signal 40 responsive to or derived from the first, second or comparable sensor signals in step 170. In an embodiment the output sensor signal 40 is a combination, for example an average, of the comparable sensor signals 40 or signals derived from the first and second sensor signals, thus reducing the variability and improving the accuracy and consistency of the output sensor signal 40 (FIGS. 1, 2).

Steps 120 to 150 can be repeatedly performed at different times and the first and second sensor signals stored in the storage circuit 34 and averaged over time or otherwise combined to improve the signal-to-noise ratio of the first and second sensor signals. Alternatively, converted, comparable sensor signals can be stored in the storage circuit 34 and averaged over time or otherwise combined to improve the signal-to-noise ratio of the comparable sensor signals.

In some methods of the present invention, if the second field sensor 20B is faulty, an output sensor signal 40 (FIGS. 1, 2) that is the first sensor signal or is derived from the first sensor signal is provided in step 180, so that the field-sensor device 99 can continue to operate. If the first field sensor 20A is faulty, an output sensor signal 40 (FIGS. 1, 2) that is the second sensor signal or is derived from the second sensor signal is provided in step 180, so that the field-sensor device 99 can continue to operate. Thus, by identifying the failed field sensor 20, the field-sensor device 99 can continue to operate by using sensed signals from other field sensors 20, in contrast to sensor systems that can detect a failure, but cannot continue to operate because no known good field-sensor signal can be identified.

Figure 8:
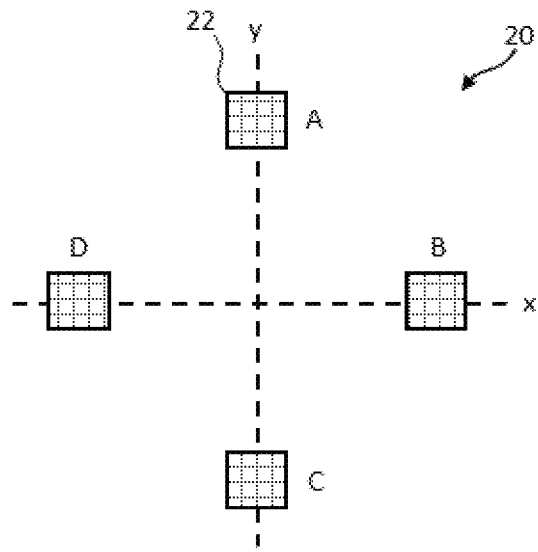
FIG. 8 is a schematic of sensor elements in a coordinate system according to illustrative embodiments of the present invention.

A field sensor 20 can be a sensor element 22 or include a single sensor element 22 or multiple sensor elements 22. Referring to FIG. 8, in embodiments of the present invention, the first field sensor 20A or the second field sensor 20B can comprise one or more sensor elements 22 or one or more pairs of sensor elements 22, for example a pair of Hall-effect sensor elements 22. As shown in FIG. 8, the field sensor 20 comprises four sensor elements 22 arranged in two orthogonal pairs (A, C and B, D) to provide measurements in each of the two dimensions corresponding to the directions of the two orthogonal pairs. Each pair of sensor elements 22 in a direction can provide a measurement of the field in that direction. Thus, in an embodiment of the present invention, either of the first or second field sensors 20A, 20B includes two sensor elements 22 arranged to detect the magnitude of a field in a first dimension or direction and two sensor elements 22 arranged to detect the magnitude of a field in a second dimension or direction different from the first dimension or direction. In some embodiments the first and second dimensions are orthogonal dimensions.

Figure 9:
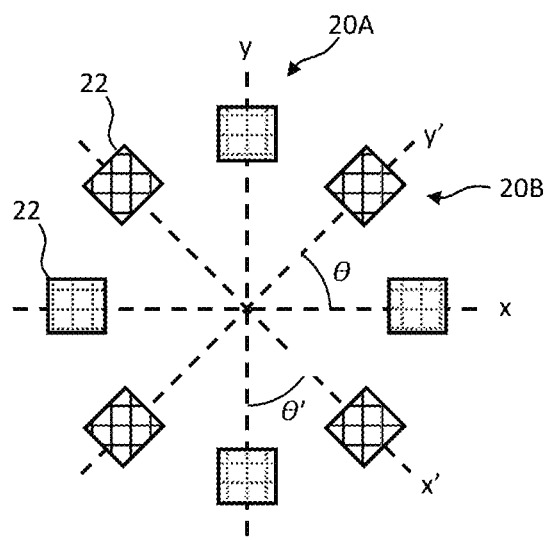
FIG. 9 is a schematic of field sensors with sensor elements in two different coordinate systems according to illustrative embodiments of the present invention.

Referring to FIG. 9, the first and second field sensors 20A, 20B are rotated by 45 degrees and arranged in a common plane so that the first orientation differs from the second orientation in two dimensions, and also correspond to the illustrations of FIGS. 1, 3, 4, 5A and 5B, and 8. In configurations of the present invention, correlation between axes of different coordinate systems is maximized at 45 degrees in a Cartesian coordinate system. In other embodiments, other coordinate systems, for example cylindrical, polar, or spherical coordinate systems are used. In general, a measurement is a projection of an actual field onto the coordinate system. In an embodiment, a method of the present invention comprises determining in step 190 (FIG. 7) which of the two or more field sensors 20 is faulty.

In an embodiment of the present invention the first and second field sensors 20A, 20B are spatially offset from each other, as shown in FIGS. 1-4. In another embodiment of the present invention, the first and second field sensors 20A, 20B spatially overlap each other, as shown in FIG. 9. In a further embodiment of the present invention, the spatially overlapping first and second field sensors 20A, 20B have a common centre, also as illustrated in FIG. 9. The first and second field sensors 20A, 20B can be provided in a common structure or device within the field-sensor device 99 of the present invention.

The field sensors 20 can be magnetic sensors such as Hall-effect sensors, magnetoresistive sensors such as extreme magnetoresistive sensors (XMR) extraordinary magnetoresistive sensors (EMR), giant magnetoresistive sensors GMR, tunneling magnetoresistive sensors (TMR), colossal magnetoresistive sensors (CMR) or anisotropic magnetoresistive sensors (AMR).

Any of the elements in the field-sensor device 99 can be analog components, include analog-to-digital convertors or can be digital components. The circuits can include a CPU with a program stored in a memory, a stored program machine, a state machine or the like. Similarly, in various embodiments of the present invention, each of the first and second field sensors 20A, 20B, and the controller 30 can be implemented in a combination of discrete circuit components or integrated circuits or can be integrated into common circuits or common integrated circuits. In some embodiments the first or second field sensors 20A, 20B or the control circuit 32 share circuit components or packages.

The first and second field sensors 20A, 20B, or the control circuit 32 can include electronic circuits, digital logic circuits, analog circuits, or mixed-signal circuits or a combination of circuit types and electronic devices. Portions or all of these circuits can be provided in one or more circuits, in common circuits, in one or more integrated circuits or packages or in common integrated circuits or packages. The various components of the field-sensor device 99 can be, for example, provided in electronic circuits, integrated circuits or discrete electronic devices that are electrically connected with wires 12.

Any one or all of the various components can be disposed on a printed circuit board or on a semiconductor substrate, or any one or all of the various components can be integrated as a circuit in or on the semiconductor substrate, or some combination of integrated circuits provided on the semiconductor substrate and circuits formed in or on the semiconductor substrate. Any one or all of the various components can be provided in packaged integrated circuits or in bare die that are placed or micro-transfer printed onto the semiconductor substrate or other substrate. Wires 12 can be provided using photolithographic methods and materials to connect the various components, integrated circuit dies, or circuits integrated on the semiconductor substrate.

Each of the first or second field sensors 20A, 20B can be any of various magnetic sensors such as Hall-effect sensors or magneto-resistive sensors and can be provided, for example, in an integrated circuit, discrete elements or as separate integrated circuit components (such as bare die) mounted on a sensor device substrate, such as a glass, ceramic, polymer or semiconductor substrate, for example by using pick-and-place, surface-mount or printing techniques. One or more of the integrated circuit components or elements of the field-sensor device 99 such as the controller 30, can be disposed on the first or second field sensor 20A, 20B as bare die deposited by micro-transfer printing and electrically connected. Alternatively, the first or second field sensors 20A, 20B can be disposed on the controller 30 as bare die deposited by micro-transfer printing and electrically connected. The control circuit 32 can be provided as a photolithographically defined circuit in a semiconductor substrate and the first or second field sensor 20A, 20B can be disposed on the semiconductor substrate as bare die and electrically connected to the control circuit 32 using photolithographic processes and materials.

Figure 10:
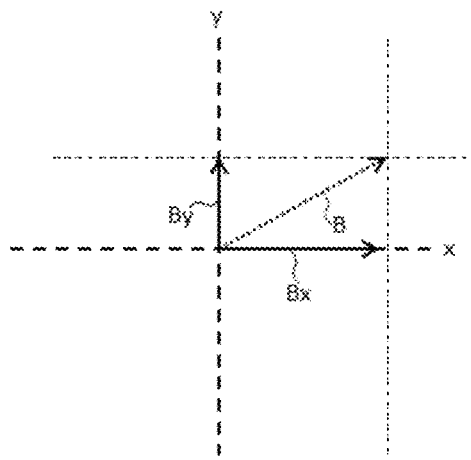
FIGS. 10 and 11 are graphic illustrations of a field vector in two different coordinate systems according to illustrative embodiments of the present invention.
Figure 11:
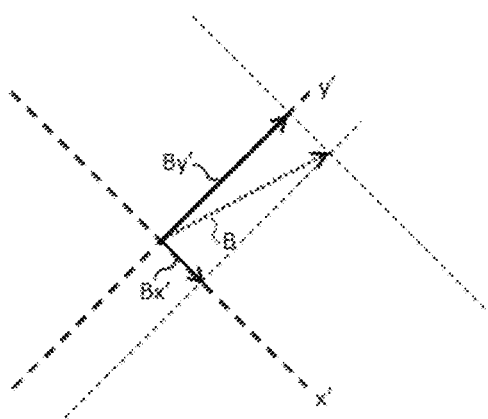

Referring to FIG. 10, an arbitrary and illustrative field vector B is illustrated with respect to the first orientation (first coordinate system) and, referring to FIG. 11, the same field vector B is illustrated with respect to the second orientation (second coordinate system). Since the field vector B is identical in both cases (FIGS. 10 and 11), the first and second sensor signal vectors measured by the first and second field sensors 20A, 20B are equivalent but are not directly comparable (i.e. the magnitude values of the field vectors in each of the measurement axes are different for the first and second orientations). However, since the relative disposition of the first field sensor 20A with respect to the second field sensor 20B can be predetermined when the field-sensor device 99 is constructed (disposed on the substrate 10 surface, FIG. 1), the first sensor signal can be converted (transformed) from the first orientation (first coordinate system) into the second orientation (second coordinate system) and the magnitudes of the field vectors directly compared. Alternatively, the second sensor signal can be converted (transformed) from the second orientation (second coordinate system) into the first orientation (first coordinate system) and the magnitudes of the field vectors directly compared. In yet other embodiments the first sensor signal can be converted into a third orientation (third coordinate system) different from the first and second orientations (first and second coordinate systems) and the second sensor signal can be likewise converted into the third orientation (third coordinate system) so that the magnitudes of the field vectors of the two converted field sensor signals can be directly compared. When the two sensor signals are converted into a common orientation (a common coordinate system), they are comparable signals. This operation can be performed as a matrix transformation with a rotation matrix. Although not required for detecting a sensor fault, in an embodiment in which the faulty sensor is identified, the measurement axes, when projected into another coordinate system, have non-diagonal sub-matrix coefficients in the transformation matrix between axis coordinates where the fault is located.

In the example illustrated in FIG. 9 (corresponding to FIGS. 1, 5A, and 5B), the first and second orientations differ by the angle θ (45°) in the x, y plane parallel to the surface of the device substrate 10 (FIG. 1) and are identical in the z dimension (orthogonal to the common plane on which the first and second field sensors 20A, 20B are disposed), so that the first and second orientations (coordinate systems) in the example of FIG. 9 differ in two dimensions or directions.

A measured field vector in the first coordinate system can have values Bx and By and the same vector measured in the second coordinate system can have values Bx' and By'. Given a known angle θ between two orientations, the x' and y' vectors can be calculated with x'=x cos(θ)+y sin(θ) and y'=y cos(θ)−x sin(θ). The reverse calculation is x=x' cos (θ)−y' sin(θ) and y=y' cos(θ)+x' sin(θ). Conversion to an arbitrary third orientation can be similarly calculated.

In a simplified example in which θ=45°, as in the example of FIGS. 1 and 9, sin(θ)=cos(θ)=1/($2^{1/2}$)=k≈0.707. The simplified equations that convert from the first coordinate system to the second coordinate system are $$x'=k(x+y), y'=k(y-x)$$

and the equations that convert from the second coordinate system to the first coordinate system are $$x=k(x'-y'), y=k(y'+x').$$

In any physical implementation, the first and second field sensors 20A, 20B are not necessarily identical and can have limitations in precision and accuracy and acceptable differences between them within a predetermined tolerance. Using orientations that differ by 45° degrees in different dimensions provides a greater magnitude difference in the different dimensions, thereby improving the ability to detect faults in each of the different dimensions, although other angles can be used.

Predetermined measurement tolerance margins can be provided to determine whether measurements from the first and second field sensors 20A, 20B are faulty. The predetermined measurement tolerance margins can be specified in each dimension (Bx, By) or as a combination specifying the single net field measurement (Be). If the comparable sensor signals derived by converting the first and second sensor signals into the same coordinate system do not differ by more than the desired tolerance margin, the comparable sensor signals can be combined and provided as the output sensor signal 40. If the comparable sensor signals differ by more than the desired tolerance margin, one of the first or second field sensors 20A, 20B is deemed to be faulty.

Figure 12:
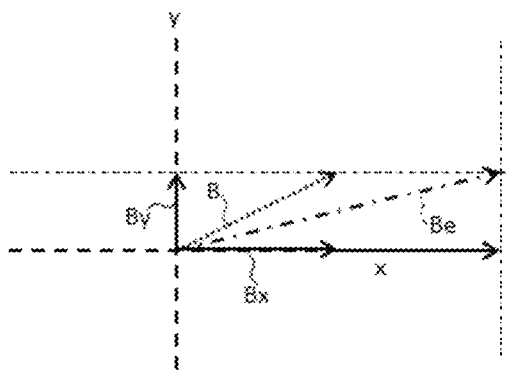
FIG. 12 is a graphic illustration of a field vector having an error in the x-coordinate measurement according to an illustrative embodiment of the present invention.
Figure 13:
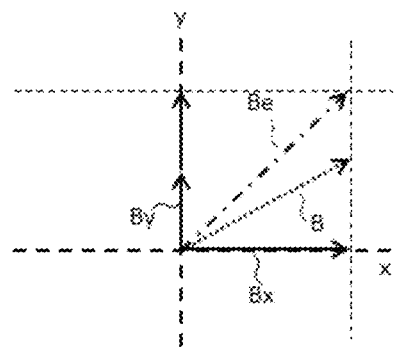
FIG. 13 is a graphic illustration of a field vector having an error in the y coordinate measurement according to an illustrative embodiment of the present invention.

As an illustration, an arbitrary field vector B is illustrated in FIG. 12 having a length in the x dimension that is twice the length in the y dimension where the length represents the field strength in the corresponding dimension. Given a first field sensor 20A in a first orientation and first coordinate system with orthogonal dimensions x, y and a second field sensor 20B in a second orientation and second coordinate system with orthogonal dimensions x', y' rotated by θ=−45 degrees from the first orientation (FIGS. 1 and 9), an error in the x-dimension sensor of the first field sensor 20A results in an erroneous field measurement $B_e$ that differs from the correct field B only in the x dimension in the first coordinate system. Referring to FIG. 13, an error in the y dimension sensor of the first field sensor 20A results in an erroneous field measurement $B_e$ that differs from the correct field B only in the y dimension in the first coordinate system.

Figure 14A:
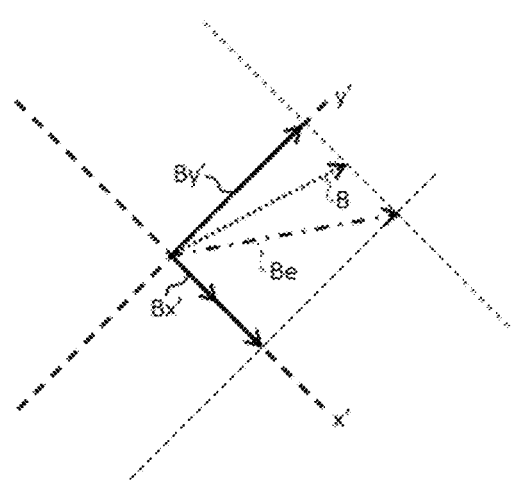
FIG. 14A is a graphic illustration of a field vector having an error in the rotated x' coordinate measurement and FIG. 14B is a graphic illustration of the measured field vector of FIG. 14A in the x, y coordinate system according to an illustrative embodiment of the present invention.
Figure 14B:
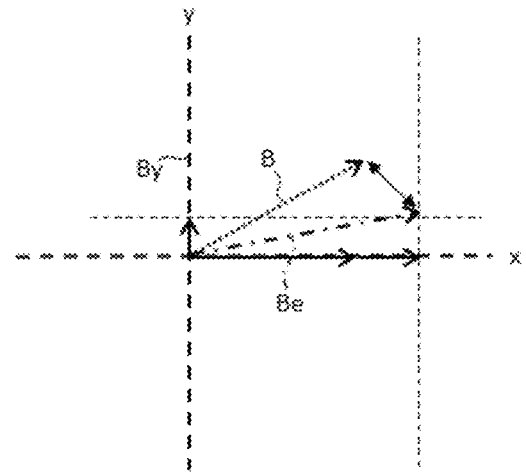
Figure 15A:
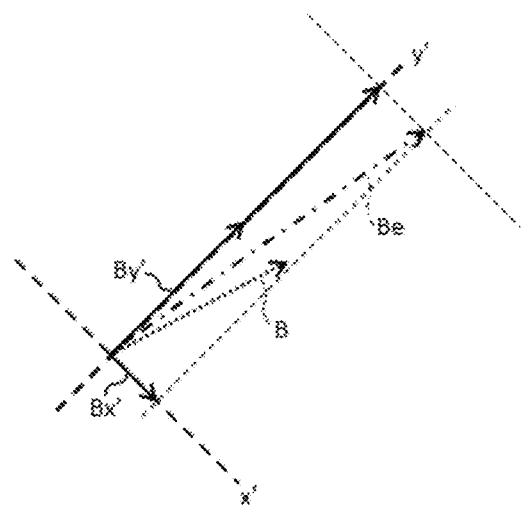
FIG. 15A is a graphic illustration of a field vector having an error in the rotated y' coordinate measurement and FIG. 15B is a graphic illustration of the measured field vector of FIG. 15A in the x, y coordinate system according to an illustrative embodiment of the present invention.

Referring to FIG. 14A, an error in the x' dimension sensor of the second field sensor 20B results in an erroneous field measurement $B_e$ that differs from the correct field B only in the x' dimension in the second coordinate system. When converted into the first coordinate system (FIG. 14B), the erroneous field measurement $B_e$ differs from the correct field B by a direction in the first coordinate system corresponding to the direction of the x' dimension in the second coordinate system (shown with the solid light arrow in FIG. 14B). Referring to FIG. 15A, an error in the y' dimension sensor of the second field sensor 20B results in an erroneous field measurement $B_e$ that differs from the correct field B only in the y' dimension in the second coordinate system. When converted into the first coordinate system (FIG. 15B), the erroneous field measurement $B_e$ differs from the correct field B by a direction in the first coordinate system corresponding to the direction of the y' dimension in the second coordinate system (shown with the solid light arrow in FIG. 15B).

In all of the examples of FIGS. 12, 13, 14A, 14B, 15A, 15B, the angular difference between the first and second coordinate system is θ=−45 degrees (as shown in FIGS. 14A, 15A) and the error is a doubling of the sensor response in the respective dimension, indicated by the two co-linear arrows in the illustrations.

Figure 15B:
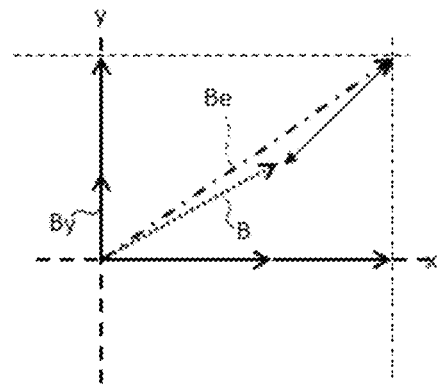

Therefore, given a difference in angle between the first and second coordinate systems of θ, an error vector E=Be−B, if E≠0 and the angle of the vector E in the first coordinate system equals:

0 degrees, the error is in the x-dimension sensor of the first field sensor 20A;

90 degrees, the error is in the y-dimension sensor of the first field sensor 20A;

θ degrees, the error is in the x'-dimension sensor of the second field sensor 20B (−45 degrees in the example of FIGS. 14A and 14B); and −θ degrees, the error is in the y'-dimension sensor of the second field sensor 20B (45 degrees in the example of FIGS. 15A and 15B).

In general, the direction of the error vector corresponds to the dimension measured by the faulty field sensor 20, so long as a fault is present only in a single field sensor dimension measurement. In other words, the error vector has a unique component in the direction of the axis (direction) of the measured faulty sensor element 22. The error vector can be expressed as a multiple of the unit vector of the axis (direction) of the faulty sensor measurement. Thus, the control circuit 32 can comprise circuitry that compares the direction of differences between the comparable sensor signals (e.g., Bx, By, Bx', By') to determine a faulty field sensor 20.

According to embodiments of the present invention, the field-sensor device 99 functions to measure fields at the same time as the first and second field sensors 20A, 20B are monitored and diagnosed if a fault is detected, to provide real-time diagnostic signals corresponding to any or both of the first and second field sensor 20A, 20B.

Embodiments of the present invention can be constructed by providing a substrate and mounting the first or second field sensor 20A, 20B and controller 30 as integrated circuits on the substrate. The integrated circuits can be disposed on the substrate surface using pick-and-place technologies or by micro-transfer printing them from corresponding source wafers onto the substrate surface. Alternatively, the substrate surface can be or include a semiconductor layer and one or more or any portion of each of the first or second field sensor 20A, 20B and controller 30 are formed in the semiconductor layer and electrically connected with any integrated circuits disposed on the substrate surface using wires 12 on the substrate surface, for example by using photolithographic or printed circuit board methods and materials. Alternatively, the control circuits 32 or field sensors 20 can be photolithographically defined in a semiconductor substrate.

The substrate can be one of many substrates with one or more surfaces capable of supporting or receiving the first or second field sensor 20A, 20B and controller 30, for example a glass, plastic, ceramic or semiconductor substrate with two opposing relatively planar and parallel sides. The substrate can have a variety of thicknesses, for example from 10 micron to several millimeter. The substrate can be a portion or surface of another device and can include electronic circuitry.

While the invention has been illustrated and described in detail in the drawings and foregoing description, such illustration and description are to be considered illustrative or exemplary and not restrictive. The foregoing description details certain embodiments of the invention. It will be appreciated, however, that no matter how detailed the foregoing appears in text, the invention may be practiced in many ways. The invention is not limited to the disclosed embodiments.

Other variations to the disclosed embodiments can be understood and effected by those skilled in the art in practicing the claimed invention, from a study of the drawings, the disclosure and the appended claims. In the claims, the word "comprising" does not exclude other elements or steps, and the indefinite article "a" or "an" does not exclude a plurality. A single processor or other unit may fulfil the functions of several items recited in the claims. The mere fact that certain measures are recited in mutually different dependent claims does not indicate that a combination of these measures cannot be used to advantage. A computer program may be stored/distributed on a suitable medium, such as an optical storage medium or a solid-state medium supplied together with or as part of other hardware, but may also be distributed in other forms, such as via the Internet or other wired or wireless telecommunication systems. Any reference signs in the claims should not be construed as limiting the scope.

The invention claimed is:

1. A field-sensor device, comprising:
    a first field sensor with first axes of measurement determined by a first coordinate system, said first field sensor responsive to an external field to produce a first sensor signal, the first sensor signal having two components according to the first coordinate system;
    a second field sensor with second axes of measurement determined by a second coordinate system different from the first coordinate system, said second field sensor responsive to the external field to produce a second sensor signal, the second sensor signal having two components according to the second coordinate system; and
    a controller having a control circuit arranged to:
    a) control said first and second field sensors responsive to the external field to produce the corresponding first and second sensor signals,
    b) convert the two components of the first or second sensor signal, or the two components of both the first and second sensor signals, to equivalent comparable components in a common coordinate system, the common coordinate system being either the first coordinate system, the second coordinate system, or a third coordinate system;
    c) compare the equivalent comparable components to determine a faulty field sensor, if any; and
    d) if a faulty field sensor is determined, provide a faulty sensor signal or, if a faulty sensor is not determined, provide an output sensor signal responsive to the first or second signals or the equivalent comparable components, or any combination thereof.

2. The field-sensor device as in claim 1, wherein the control circuit is arranged to determine which of the first and second field sensors is faulty.

3. The field-sensor device as in claim 1, wherein the external field is a magnetic field, an electric field, a pressure field or a gravitational field.

4. The field-sensor device as in claim 1, wherein the first coordinate system differs from the second coordinate system in two dimensions or in three dimensions.

5. The field-sensor device as in claim 1, wherein the control circuit comprises a storage circuit for storing the two components of any one or more of the first sensor signal, the second sensor signal, and any of the equivalent comparable components, or a rotation matrix.

6. The field-sensor device as in claim 1, wherein the first or second field sensor comprises one or more sensor elements or one or more pairs of sensor elements.

7. The field-sensor device as in claim 1, wherein the first and second field sensors are disposed on a device substrate comprising a substrate material, and wherein the first and second field sensors comprise one or more sensor materials at least partially different from the substrate material.

8. The field-sensor device as in claim 7, wherein the substrate material is a semiconductor and the control circuit is at least partially formed in or on the semiconductor substrate material of the device substrate.

9. The field-sensor device as in claim 7, wherein the control circuit comprises a control-circuit material that is at least partially different from the substrate material and wherein the control circuit is disposed on the device substrate.

10. The field-sensor device as in claim 1, wherein the control circuit comprises a first circuitry that uses the direction of differences between the equivalent comparable components to determine a faulty field sensor or wherein the control circuit comprises a second circuitry that uses the first and second components of the first and second field sensor signals, respectively to determine a faulty field sensor.

11. A field-sensor diagnostic method, comprising the following steps:
    a) controlling first and second field sensors responsive to an external field to produce respective first and second sensor signals, said first sensor signal having two components determined according to a first coordinate system and said second sensor signal having two components determined according to a second coordinate system different from said first coordinate system;
    b) receiving said first and second sensor signals;
    c) converting the two components of said first or second sensor signal, or the two components of both the first and second sensor signals, to equivalent comparable components in a common coordinate system, the common coordinate system being either the first coordinate system, the second coordinate system, or a third coordinate system;
    d) comparing said equivalent comparable components and determining if the first or second field sensor is faulty; and
    e) if a faulty field sensor is determined, providing a faulty sensor signal responsive to said equivalent comparable components or, if a faulty field sensor is not determined, providing an output sensor signal responsive to said first or second sensor signals, or the equivalent comparable components.

12. The method as in claim 11, comprising performing the steps a)-d) at a first time and storing the two components of the first, second, or any of the equivalent comparable components, repeating the steps a)-d) at a second time different from the first time, and comparing the two components of any one or more of said stored first or second sensor signals or equivalent comparable components of the first time and the two components of any one of the first or second sensor signals, or the equivalent comparable components of the second time.

13. The method as in claim 11, comprising:
   a) if said second field sensor is faulty, providing said output sensor signal that is said first sensor signal or is derived from said first sensor signal, or
   b) if said first field sensor is faulty, providing said output sensor signal that is said second sensor signal or is derived from said second sensor signal.

14. The method as in claim 11, wherein said first field sensor or said second field sensor is faulty and comprising determining which of said first field sensor or second field sensor is faulty by comparing said equivalent comparable components.

15. The method as in claim 11, comprising combining said equivalent comparable components to provide said output sensor signal or combining signals derived from said first and second sensor signals to provide said output sensor signal.

* * * * *